United States Patent [19]

Nakura et al.

[11] Patent Number: 5,629,551
[45] Date of Patent: *May 13, 1997

[54] SEMICONDUCTOR DEVICE COMPRISING AN OVER-TEMPERATURE DETECTION ELEMENT FOR DETECTING EXCESSIVE TEMPERATURES AMPLIFIERS

[75] Inventors: Hideaki Nakura, Osaka; Masami Yokozawa, Kyoto; Kazuhiko Tsubaki, Hyogo; Masasuke Yoshimura, Kyoto, all of Japan

[73] Assignee: Matsushita Electric Industrial Co., Ltd., Osaka, Japan

[*] Notice: The term of this patent shall not extend beyond the expiration date of Pat. No. 5,461,252.

[21] Appl. No.: 503,688

[22] Filed: Jul. 18, 1995

Related U.S. Application Data

[62] Division of Ser. No. 391,833, Feb. 17, 1995, Pat. No. 5,461,252, which is a continuation of Ser. No. 119,575, Sep. 13, 1993, abandoned.

[30] Foreign Application Priority Data

| Oct. 6, 1992 | [JP] | Japan | 4-267307 |
| Oct. 6, 1992 | [JP] | Japan | 4-267310 |
| Oct. 6, 1992 | [JP] | Japan | 4-267311 |
| Apr. 9, 1993 | [JP] | Japan | 5-82909 |

[51] Int. Cl.⁶ .......... H01L 29/47; H01L 29/812; H01L 27/095
[52] U.S. Cl. .......... 257/470; 257/467; 257/552; 257/567; 257/577
[58] Field of Search .......... 257/567, 467, 257/470, 552, 570, 577

[56] References Cited

U.S. PATENT DOCUMENTS

| 4,730,228 | 3/1988 | Einzinger et al. | 361/103 |
| 4,760,434 | 7/1988 | Tsuzuki et al. | 357/23.13 |
| 4,896,199 | 1/1990 | Tsuzuki et al. | 357/28 |
| 5,461,252 | 10/1995 | Nakura et al. | 257/470 |

FOREIGN PATENT DOCUMENTS

| 62-229866 | 10/1987 | Japan . |
| 63-310157 | 12/1988 | Japan . |
| 1-290249 | 11/1989 | Japan . |
| 1-302849 | 12/1989 | Japan . |
| 3-50762 | 3/1991 | Japan . |

Primary Examiner—Ngân V. Ngô
Attorney, Agent, or Firm—McDermott, Will & Emery

[57] ABSTRACT

A semiconductor device includes on a semiconductor substrate an output transistor which is composed of a collector region, a first base region and a first emitter region, and a temperature detection transistor composed of the collector region, a second base region and a second emitter region. The output transistor is provided at a center of the collector region of the semiconductor substrate. A vacant region is formed on a center of the output transistor, and the temperature detection transistor is provided in the vacant region.

7 Claims, 8 Drawing Sheets

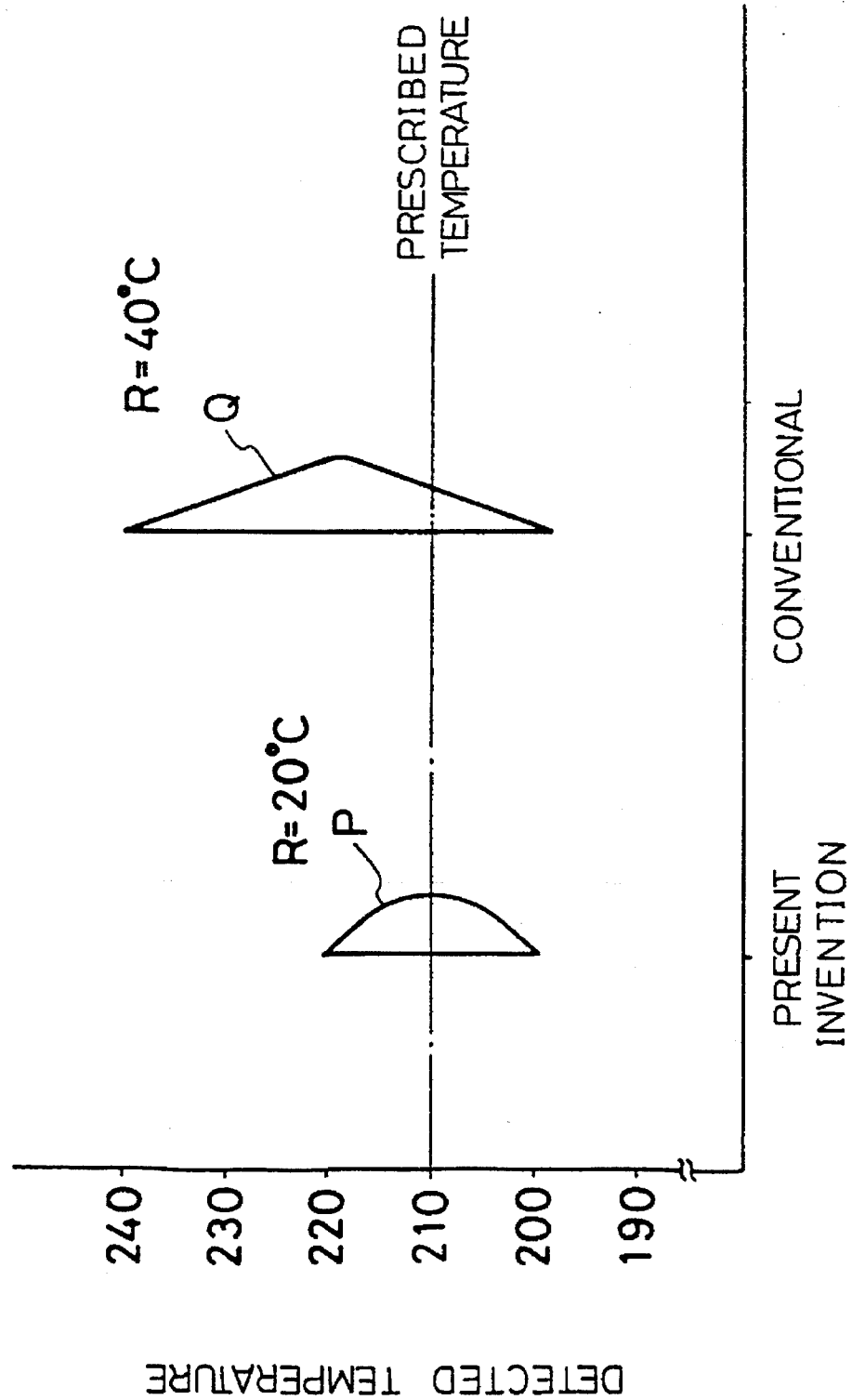

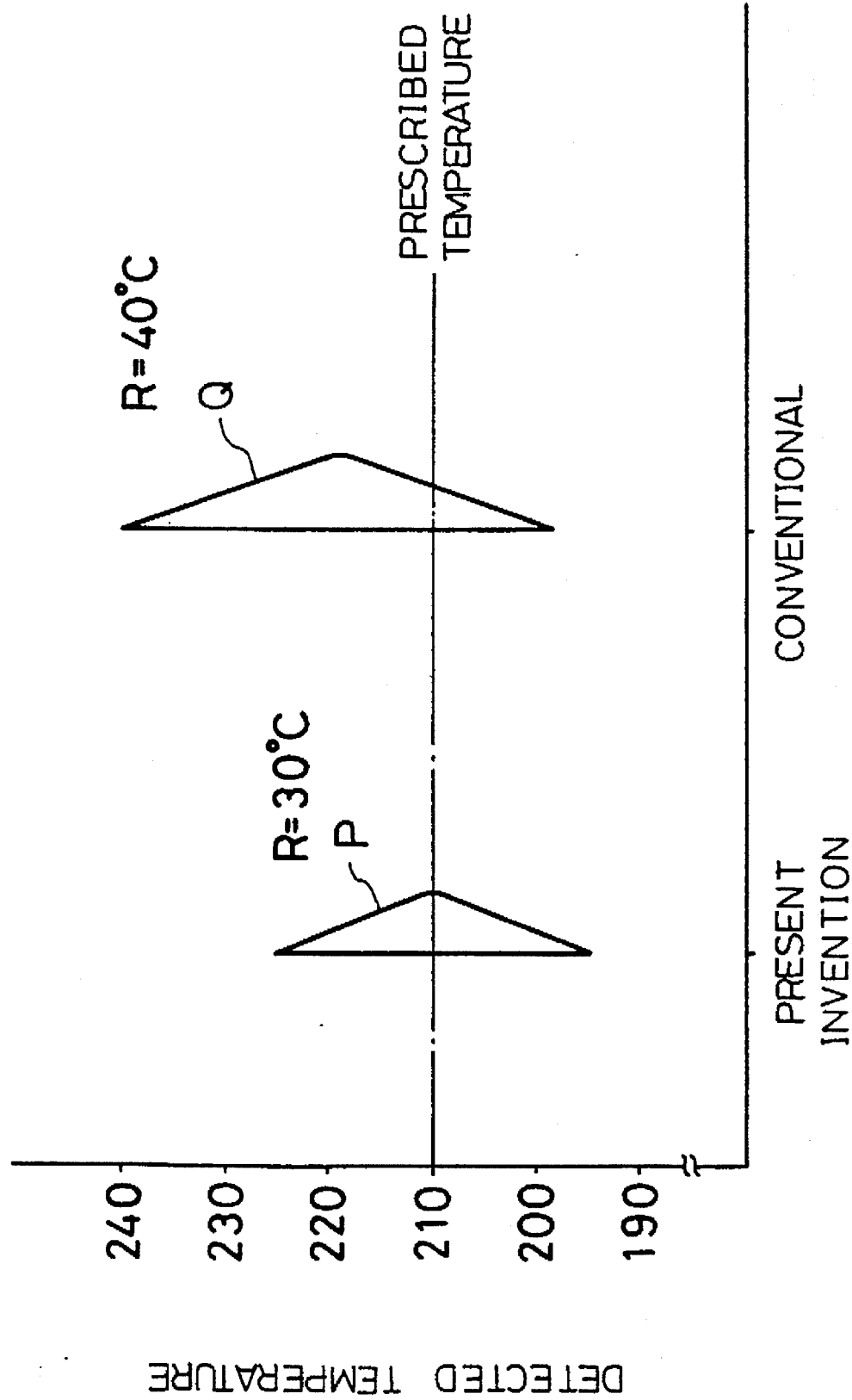

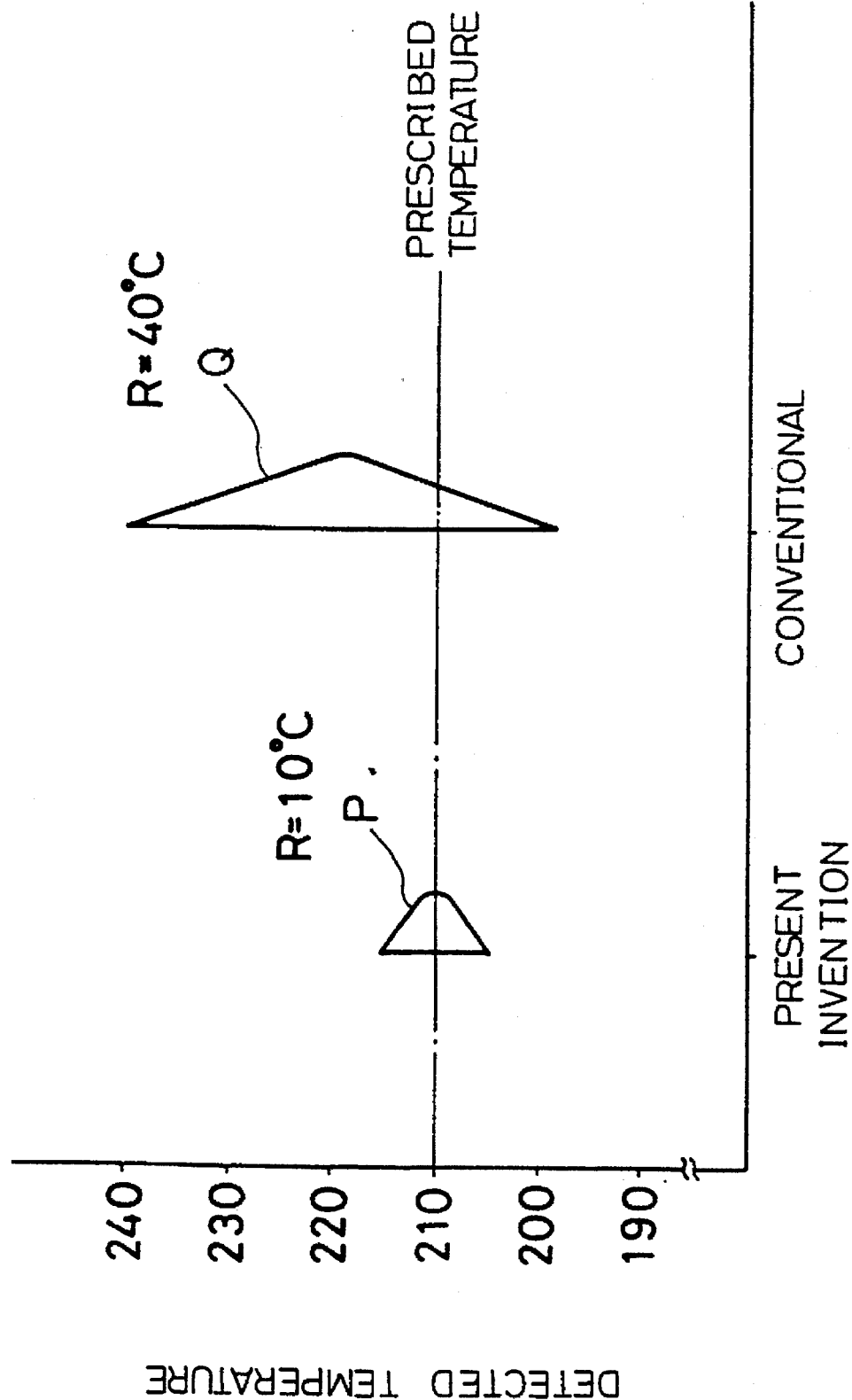

SEMICONDUCTOR DEVICE COMPRISING AN OVER-TEMPERATURE DETECTION ELEMENT FOR DETECTING EXCESSIVE TEMPERATURES AMPLIFIERS

This is a division now U.S. Pat. No. 5,461,252, of application Ser. No. 08/391,833, filed Feb. 17, 1995, which is a continuation of Ser. No.: 08/119,575, filed Sep. 13, 1993, now abandoned.

BACKGROUND OF THE INVENTION

This invention relates to a semiconductor device having a function of obviating thermal breakdown due to temperature rise of a semiconductor element for output, and particularly relates to a high-functional semiconductor device having a semiconductor element for output which deals with large current.

Conventionally, as a semiconductor device having a function of protecting a semiconductor element for output which is formed on a semiconductor substrate from thermal breakdown, there is a known technique that a temperature sensor composed of a thermistor is provided near a semiconductor element for output at an external part of the semiconductor substrate and the temperature sensor detects the temperature of the semiconductor element for output so that current is intercepted when the detected temperature rises to a prescribed temperature.

In the above semiconductor device, however, since the temperature sensor is provided outside of the semiconductor substrate, a time lag and a dispersion of temperature difference are caused between the temperature of the semiconductor element for output and the detected temperature by the temperature sensor.

With either the time lag or the dispersion of temperature difference between the temperature of the output semiconductor element and the detected temperature by the temperature sensor, even when the output semiconductor element reaches the danger temperature which may involve a thermal breakdown, the temperature: sensor cannot detect the danger temperature which the output semiconductor element reaches, thus the output semiconductor element shall be broken down.

Proposed in Japanese Patent Application Laying Open Gazette No. 3-276636 is, as shown in FIGS. 8(a), (b), a semiconductor device in which an output transistor 61 is formed on one side of a semiconductor substrate 60 and a temperature detection resistor 62 for detecting the temperature of the output transistor 61 is provided on the other side thereof. In FIGS. 8(a), (b), reference numeral 63 is a collector region of the output transistor 61, 64 is a base region thereof, 65 is an emitter region thereof, and 66 is a resistor electrode of the temperature detection resistor 62.

Also, a semiconductor integrated circuit device having a temperature detection element at a main heat generation part on a semiconductor substrate is proposed in Japanese Patent Application Laying Open Gazette No. 1-290249.

In the above two semiconductor devices, the problem of the time lag between the temperature of the output semiconductor element and the detected temperature by the temperature detection element is almost overcome because the temperature detection element is provided on the semiconductor substrate.

As explained below, however, the problem that the output semiconductor element nay be break down without the danger temperature of the output semiconductor element detected by the temperature sensor though the output semiconductor element reaches the danger temperature still remains in the above two semiconductor devices.

In the former semiconductor device, since the output transistor is provided on one side of the semiconductor substrate and the temperature detection resistor is provided on the other side thereof, the gap between the temperature of the output transistor and the detected temperature by the temperature detection resistor is unavoidable. Even with the gap between the temperature of the output semiconductor element and the detected temperature, that the output semiconductor element reaches the danger temperature is detected anyhow by previously obtaining a correlatively therebetween. However, since the part at which the output semiconductor element on the semiconductor substrate is provided is far from the part at which the temperature detection element on the semiconductor substrate detects the temperature, the gap between the actual temperature of the output semiconductor element and the detected temperature by the temperature detection element results. As far as the gap are present between the temperature of the output semiconductor element and the detected temperature by the temperature detection element, the dispersion of the temperature gap is unavoidable. Therefore, the former semiconductor device has the problem that the temperature detection element does not detect the danger temperature of the output semiconductor element even when the output semiconductor element reaches the danger temperature.

In the latter semiconductor integrated circuit device, the part where the main heat generation part on the semiconductor substrate is provided is not always a part where the temperature rises the highest in the semiconductor device. The part of the main heat generation part is the part where the temperature rises the highest when it is provided on a center part of the substrate, but when the main heat generation part is formed on a side of the semiconductor substrate as disclosed in Japanese Patent Application Laying Open Gazette No. 1-290249, heat is likely to emit from the main heat generation part on the substrate and is hard to emit from the center part thereof. Therefore, when the output semiconductor element is formed on the center part of the substrate or the near part thereof, the temperature detection element does not detect that the output semiconductor element reaches the danger temperature even when it does so.

SUMMARY OF THE INVENTION

The present invention has its object of providing a semiconductor device whose temperature detection element is capable of detecting rapidly, accurately that the output semiconductor element reaches the danger temperature.

A first semiconductor device according to the present invention comprises:

a semiconductor substrate;

an output semiconductor element formed on said semiconductor substrate and has on a center part thereof a vacant region; and a temperature detection element, provided in said vacant region, for detecting a temperature of said output semiconductor element.

With the above construction, the temperature detection element is surrounded by the output semiconductor element, so that the temperature detection element detects a mean value of the temperature at each part of the output semiconductor element. Thereby, the gap between the temperature of the output semiconductor element and the detected temperature by the temperature detection element is made extremely small, so that the dispersion of the temperature gap is made small. Hence, the temperature detection element can detect accurately that the output semiconductor element reaches the danger temperature.

A second semiconductor device according to the present invention comprises:

a semiconductor substrate;

an output semiconductor element formed on said semiconductor substrate; and a temperature detection element, provided on a center part of said semiconductor substrate, for detecting a temperature of said output semiconductor element.

Consequently, the temperature detection element can detect the temperature of the center part of the semiconductor substrate which increases in temperature owing to heat storage, so that the temperature detection element can accurately detect that the output semiconductor element reaches the danger temperature.

Preferably, the temperature detection elements in first and second semiconductor devices are each a temperature detection transistor.

As is generally known, a Forward voltage $V_{BE}$ at a PN junction part between a base region and an emitter region of a transistor varies linearly in accordance with temperature variation of the PN junction part, and a ratio between the forward voltage $V_{BE}$ and the temperature of the PN junction part under a given condition is 2 mV/°C. For example, the temperature of the PN junction part of the transistor is 100° C. when the forward voltage $V_{BE}$ at the PN junction part is 200 mV, and the temperature thereof is 150° C. when the forward voltage $V_{BE}$ thereat is 300 mV. Therefore, the transistor can serve as the temperature detection element surely.

A pair of transistor in Darlington-connection is preferably used as the temperature detection transistor.

Since the Darlington transistor has two PN junction parts, the ratio between the forward voltage $V_{BE}$ of the Darlington transistor and the temperature of the PN junction parts are 4 mV/°C. Accordingly, the forward voltage of the Darlington transistor with respect to the temperature variation doubles that of a single transistor, thus enhancing an accuracy of the temperature detection of the output semiconductor element.

In first or second semiconductor devices, the temperature detection element may be a temperature detection diode.

As is generally known, the forward voltage $V_F$ at a PN junction part of a diode varies linearly in accordance with temperature variation of the PN junction part, and a ratio between the forward voltage $V_F$ and the temperature of the PN junction part under a given condition is 2 mV/°C. For example, the temperature of the PN junction part of the diode is 150° C. when the forward voltage $V_F$ at the PN junction part is 300 mV, and the temperature thereof is 200° C. when the forward voltage thereat $V_F$ is 400 mV. Therefore, the diode can serve as the temperature detection element surely.

In first or second semiconductor devices, the temperature detection element may be a temperature detection resistor.

As is generally known, a resistance of a resistor varies linearly in accordance with temperature variation of the resistor. Therefore, the resistors can serve as the temperature detection element surely.

In first or second semiconductor devices, the temperature detection element is preferably formed in the same process as that for the output semiconductor element.

Consequently, fluctuation of performance of the output semiconductor element and that of the temperature detection element are made similar to each other, thus extremely reducing the dispersion of gap between the temperature of the output semiconductor element and the detected temperature by the temperature detection element.

When the output semiconductor element is an output transistor, first or second semiconductor devices is remarkably effective.

Because, the temperature of the output transistor which is likely to be broken owing to a liable temperature rise during operation is accurately detected.

When the output semiconductor element is the output transistor, it is preferable that said temperature detection element is a temperature detection transistor, a collector of said output transistor and a collector of said temperature detection transistor are formed in a same region, a base of said output transistor and a base of said temperature detection transistor are respectively formed in different regions, and an emitter of said output transistor and an emitter of said temperature detection transistor are respectively formed in different regions.

Accordingly, the output transistor and the temperature detection transistor can be formed easily, accurately.

BRIEF DESCRIPTION OF THE DRAWINGS

FIGS. 1(a) and (b) show a semiconductor device according to A first embodiment of the present invention, in which FIG. 1(a) is a plan view thereof and FIG. 1(b) is a section taken along I—I in FIG. 1(a).

FIGS. 2(a) and (b) show a semiconductor device according to a second embodiment of the present invention, in which FIG. 2(a) is a plan view thereof and FIG. 2(b) is a section taken along II—II in FIG. 2(a).

FIGS. 3(a) and (b) show a semiconductor device according to a third embodiment of the present invention, in which FIG. 3(a) is a plan view thereof and FIG. 3(b) is a section taken along III—III in FIG. 3(a).

FIGS. 4(a) and (b) show a semiconductor device according to a fourth embodiment of the present invention, in which FIG. 4(a) is a plan view thereof and FIG. 4(b) is a section taken along IV—IV in FIG. 4(a).

FIG. 5 is an explanatory drawing showing a dispersion of detected temperature of the semiconductor device according to the first embodiment, comparing with a dispersion of detected temperature of a conventional semiconductor device.

FIG. 6 is an explanatory drawing showing a dispersion of detected temperature of the semiconductor devices according to second and third embodiments, comparing with the dispersion of detected temperature of the conventional semiconductor device.

FIG. 7 is an explanatory drawing showing a dispersion of detected temperature of the semiconductor device according to the fourth embodiment, comparing with the dispersion of detected temperature of the conventional semiconductor device.

FIGS. 8(a) and (b) show the conventional semiconductor device, in which FIG. 8(a) is a plan view thereof and FIG. 8(b) is a section taken along VIII—VIII in FIG. 8(a).

DETAILED DESCRIPTION OF PREFERRED EMBODIMENTS

Description is made below about a semiconductor device according to a first embodiment of the present invention.

Figure 1A:
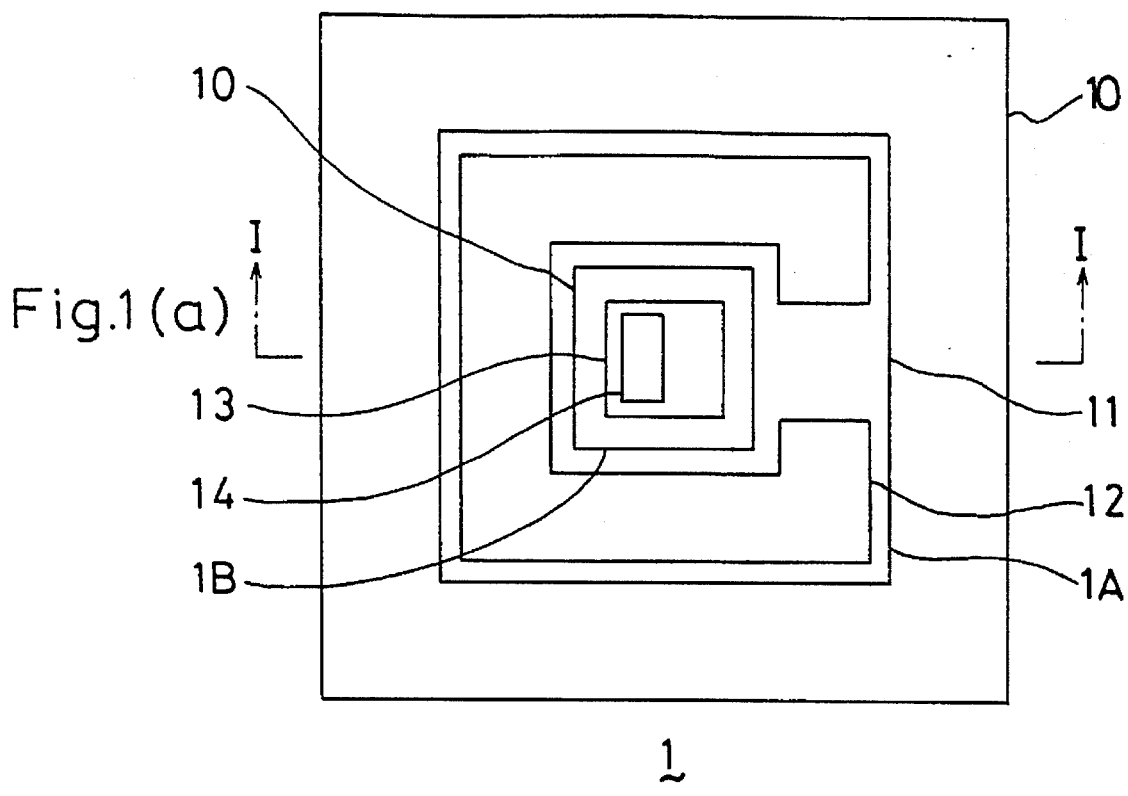
Figure 1B:
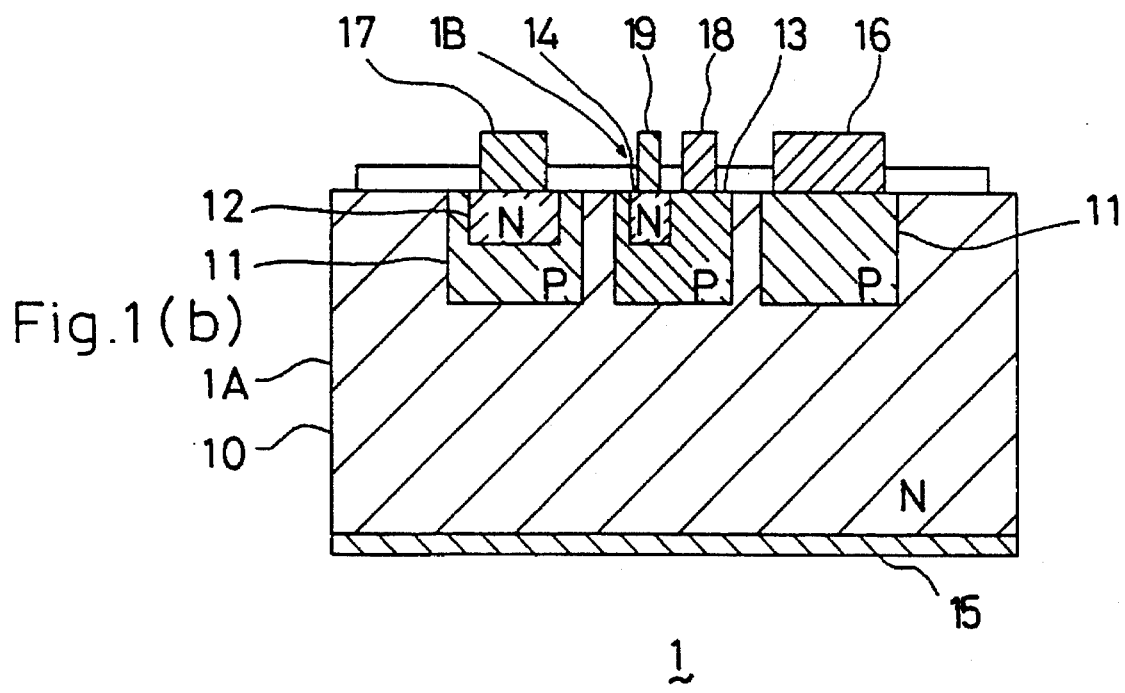

FIGS. 1(a) and (b) show a semiconductor device 1 according to the first embodiment, in which FIG. 1(a) is a plan view thereof and FIG. 1(b) is a section taken along I—I in FIG. 1(a). For the brevity's sake, electrodes are omitted in FIG. 1(a).

As shown in FIGS. 1(a), (b), the semiconductor device 1 includes a collector region 10 which is an N-type silicon substrate, an annular first base region 11 formed on a center part of the collector region 10, a C-shaped first emitter formed on the first base region 11, a cubic second base region 13 formed in a vacant region within the first base region 11 and the first emitter region 12 on the collector region 10, and a second emitter region 14 in the form of rectangular solid which is formed on the second base region 13.

A collector electrode 15 is provided at a lower surface of the collector region 10. A first base electrode 16 is provided on the first base region 11. A first emitter electrode 17 is provided on the first emitter region 12. A second base electrode 18 is provided on the second base region 13. A second emitter electrode 19 is provided on the second emitter region 14.

An output transistor 1A is, as an output semiconductor element, composed of the collector region 10, the first base region 11 and the first emitter region 12, and a temperature detection transistor 1B is, as a temperature detection element, composed of the collector region 10, the second base region 13 and the second emitter region 14. As described above, the temperature detection transistor 1B is provided at a center part of the N-type silicon substrate which composes the collector region 10, and the output transistor 1A is provided so as to surround the temperature detection transistor 1B.

Discussed below is about a method of manufacturing the semiconductor device 1 according to the first embodiment.

First, boron is selectively diffused in an N-type silicon substrate (to be the collector region 10 of NPN transistor) in which phosphorus is diffused so as to concurrently form the first base region 11 and the second base region 13 which are separated from each other.

Next, phosphorus is selectively diffused in first and second base regions 11, 13 to form the first emitter region 12 and the second emitter region 14 respectively. Thereafter, the collector electrode 15, the first base electrode 16, the first emitter electrode 17, the second base electrode 18 and the second emitter electrode 19 are provided respectively at the lower surface of the collector region 10, on the first base region 11, on the first emitter region 12, on the second base region 13 and on the second emitter region 14.

In this way, the output transistor 1A of NPN transistor and the temperature detection transistor 1B of NPN transistor are formed respectively on the N-type silicon substrate.

Explained below is about a method for detecting temperature of the output transistor 1A by the temperature detection transistor 1B in the semiconductor device 1 according to the first embodiment.

When about 1V voltage is applied between the second base electrode 18 and the second emitter electrode 19 of the temperature detection transistor 1B and the output transistor 1A is operated at 40 W (20 V voltage, 2 A current, 50% duty), a forward voltage $V_{BE}$ at a PN junction part between the second base region 13 and the second emitter region 14 of the temperature detection transistor 1B measures 340 mV. When the output transistor 1A is operated at 60 W (20 V voltage, 3 A current, 50% duty), the forward voltage $V_{BE}$ at the PN junction part of the temperature detection transistor 1B measures 460 mV.

On the other hand, when temperature of the output transistor 1A operated in steady state is measured using a thermocouple, the temperature of the output transistor 1A is 170° C. at 40 W and 230° C. at 60 W.

The forward voltage $V_{BE}$ at the PN junction part of the temperature detection transistor 1B means a voltage margin between the second base electrode 18 and the second emitter electrode 19 of the temperature detection transistor 1B, and varies according to the temperature of the PN junction part of the temperature detection transistor 1B.

By obtaining beforehand a correlatively between the temperature of the output transistor 1A and the forward voltage $V_{BE}$ of the temperature detection transistor 1B, the temperature of the output transistor 1A is made correspondent to the forward voltage $V_{BE}$ at the PN junction part of the temperature detection transistor 1B. Accordingly, the temperature of the output transistor 1A is easily detected by measuring the forward voltage $V_{BE}$ at the PN junction part of the second base region 13 and the second emitter region 14 of the temperature detection transistor 1B.

In the semiconductor device 1 according to the first embodiment, since the temperature detection transistor 1B is formed within the output transistor 1A, a dispersion of the detected temperature due to difference in location between the output transistor 1A and the temperature detection transistor 1B is reduced, and the time lag between the temperature of the output transistor 1A and the detected temperature due to the distance between the output transistor 1A and the temperature detection transistor 1B is cleared.

Consequently, with the semiconductor device 1 according to the first embodiment, accuracy and rapidity in detecting the temperature of the output transistor 1A is enhanced.

Description is made below about a semiconductor device according to a second embodiment of the present invention.

Figure 2A:
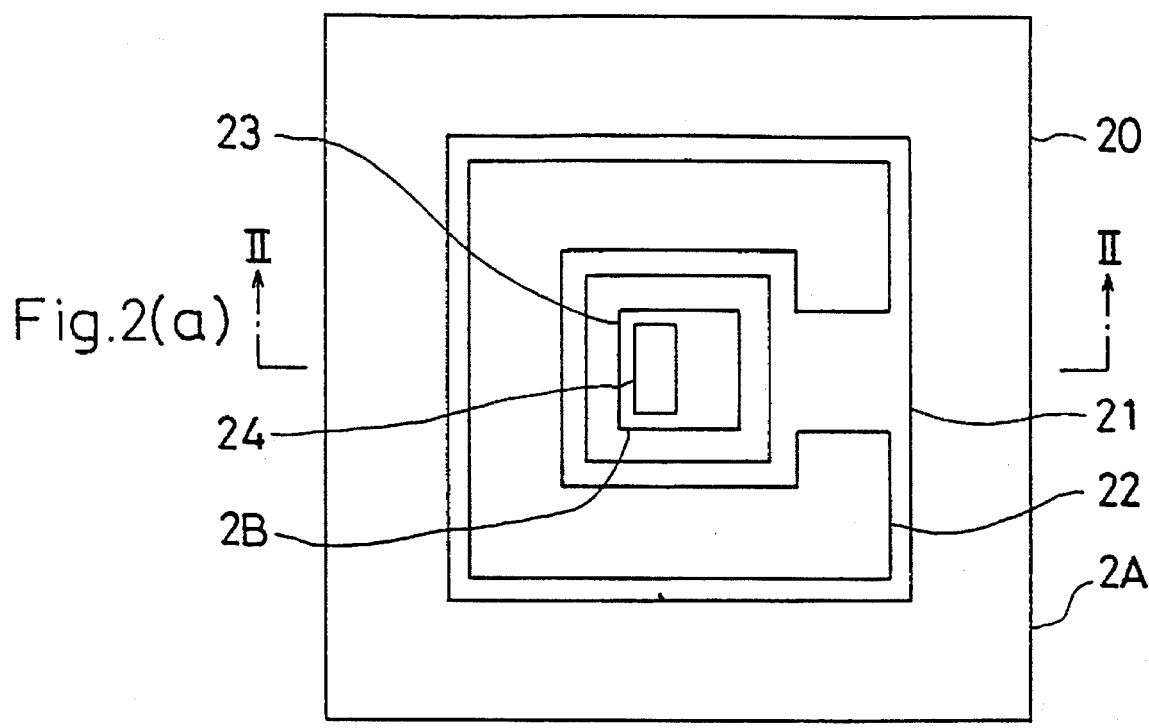
Figure 2B:
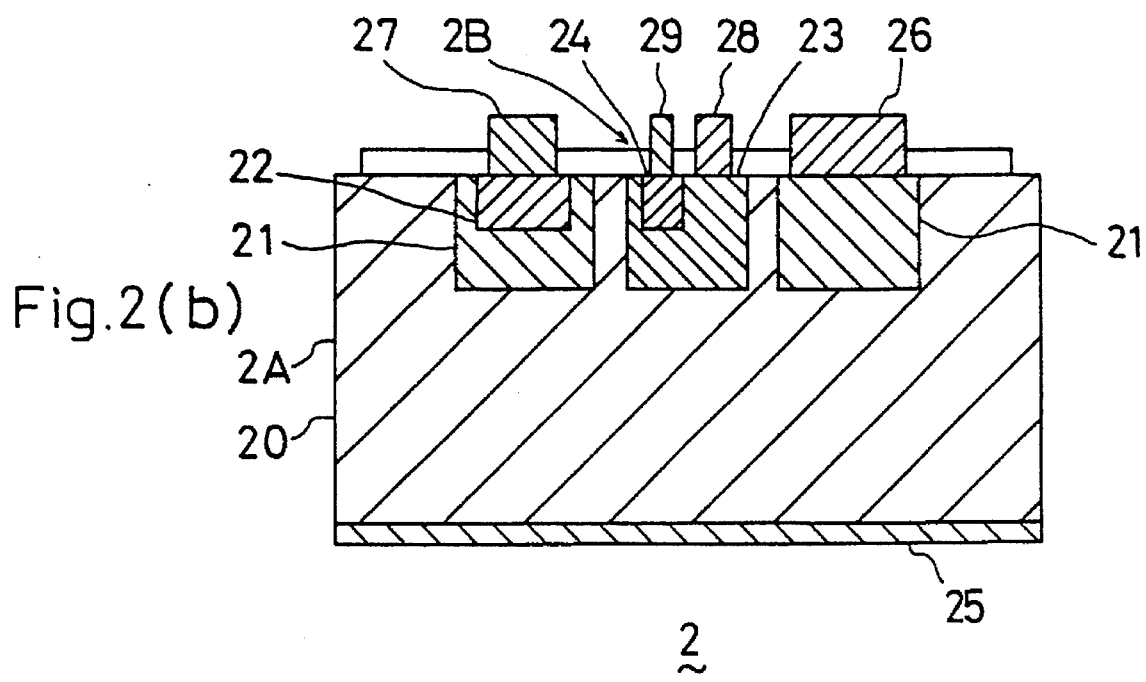

FIGS. 2(a) and (b) show a semiconductor device 2 according to the second embodiment, in which FIG. 2(a) is a plan view thereof and FIG. 2(b) is a section taken along II—II in FIG. 2(a). For the brevity's sake, electrodes are omitted in FIG. 2(a).

As shown in FIGS. 2(a) and (b), the semiconductor device 2 includes a collector region 20 which is an N-type silicon substrate, an annular base region 21 formed on a center of the collector region 20, a C-shaped emitter region 22 formed on the base region 21, a cubic cathode region 23 formed in a vacant region within the base region 21 and the emitter region 22 on the collector region 20, and an anode region 24 in the form of rectangular solid which is formed on the cathode region 23.

A collector electrode 25 is provided at a lower surface of the collector region 20. A base electrode 26 is provided on the base region 21. An emitter electrode 27 is provided on the emitter region 22. A cathode electrode 28 is provided on the cathode region 23. An anode electrode 29 is provided on the anode region 24.

An output transistor 2A is, as an output semiconductor element, composed of tile collector region 20, the base region 21 and the emitter region 22, and a temperature detection diode 2B is, as a temperature detection element, composed of the cathode region 23 and the anode region 24. As described above, the temperature detection diode 2B is provided at a center part of the N-type silicon substrate which composes the collector region 20, and the output transistor 2A is provided so as to surround the temperature detection diode 2B.

Discussed below is about a method of manufacturing the semiconductor device 2 according to the second embodiment.

First, boron is selectively diffused in an N-type silicon substrate (to be the collector region 20 of NPN transistor) in which phosphorus is diffused so as to form the base region 21 of the NPN transistor and the cathode region 23 of the diode at the same time.

Next, phosphorus is selectively diffused in the base region 21 and the cathode region 23 to form the emitter region 22 of NPN transistor and the anode region 24 of the diode respectively. Thereafter, the collector electrode 25, the base electrode 26, the emitter electrode 27, the cathode electrode are provided respectively at the lower surface of the collector region 20, on the base region 21, on the emitter region 22, on the cathode region 23 and on the anode region 24.

In this way, the output transistor 2A of NPN transistor and the temperature detection diode 2B are formed respectively on the N-type silicon substrate.

Explained below is about a method for detecting temperature of the output transistor 2A by the temperature detection diode 2B in the semiconductor device 2 according to the second embodiment.

When about 1 V voltage is applied between the cathode electrode 28 and anode electrode 29 of the temperature detection diode 2B and the output transistor 2A is operated at 40 W (20 V voltage, 2 A current, 50% duty), a forward voltage $V_F$ at a PN junction part of the cathode region 23 and the anode region 24 of the temperature detection diode 2B measures 340 mV. When the output transistor 2A is operated at 60 W (20 V voltage, 3 A current, 50% duty), the forward voltage $V_F$ at the PN junction part of the temperature detection diode 2B measures 460 mV.

On the other hand, when a temperature of the output transistor 2A operated in steady state is measured using a thermocouple, the temperature of the output transistor 2A is 170° C. at 40 W and 230° C. at 60 W.

The forward voltage $V_F$ at the PN junction part of the temperature detection diode 2B means a voltage difference between the cathode electrode 28 and the anode electrode 29 of the temperature detection diode 2B, and varies according to the temperature of the PN junction part of the temperature detection diode 2B.

By obtaining beforehand a correlatively between the temperature of the output transistor 2A and the forward voltage $V_F$ of the temperature detection diode 2B, the temperature of the output transistor 2A is made correspondent to the forward voltage $V_F$ at the PN junction part of the temperature detection diode 2B. Accordingly, the temperature of the output transistor 2A is easily detected by measuring the forward voltage $V_F$ at the PN junction part between the cathode region 23 and the anode region 24 of the temperature detection diode 2B.

In the semiconductor device 2 according to the second embodiment, since the temperature detection diode 2B is formed within the output transistor 2A, a dispersion of the detected temperature due to difference in location between the output transistor 2A and the temperature detection diode 2B is reduced, and the time lag between the temperature of the output transistor 2A and the detected temperature due to the distance between the output transistor 2A and the temperature detection diode 2B is cleared.

Consequently, with the semiconductor device 2 according to the second embodiment, accuracy and rapidity in detecting the temperature of the output transistor 2A is enhanced.

Discussed next is about a semiconductor device according to a third embodiment of the present invention.

Figure 3A:
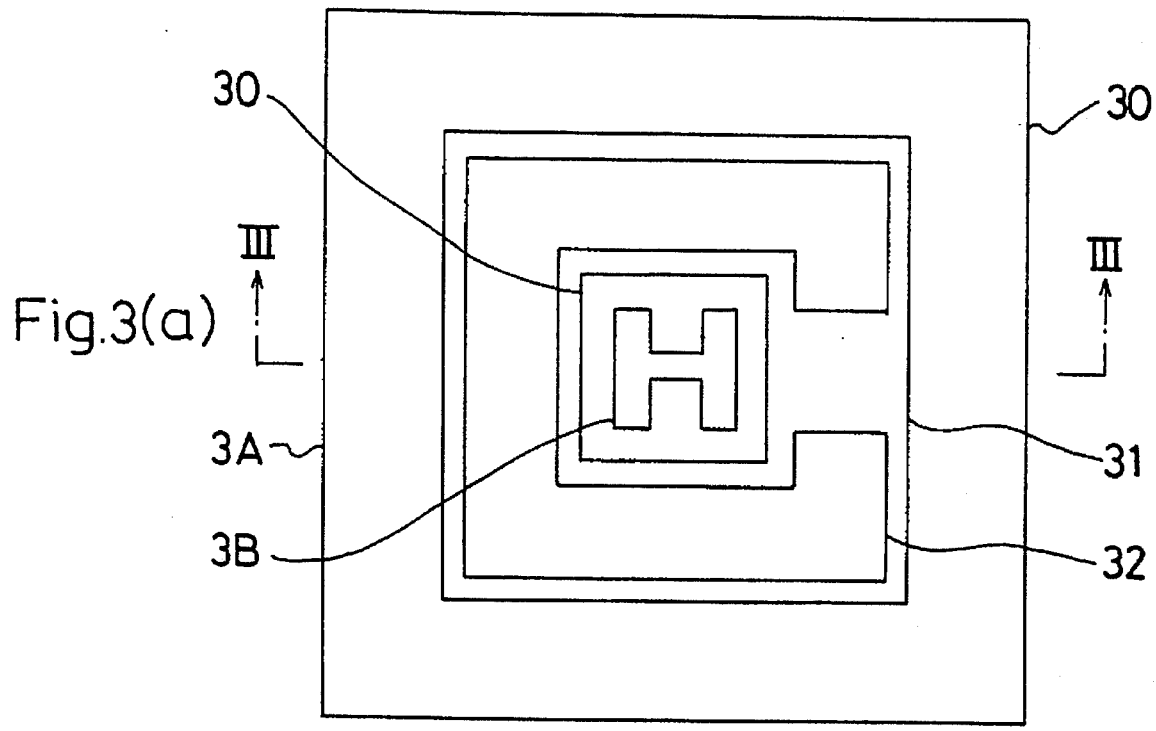
Figure 3B:
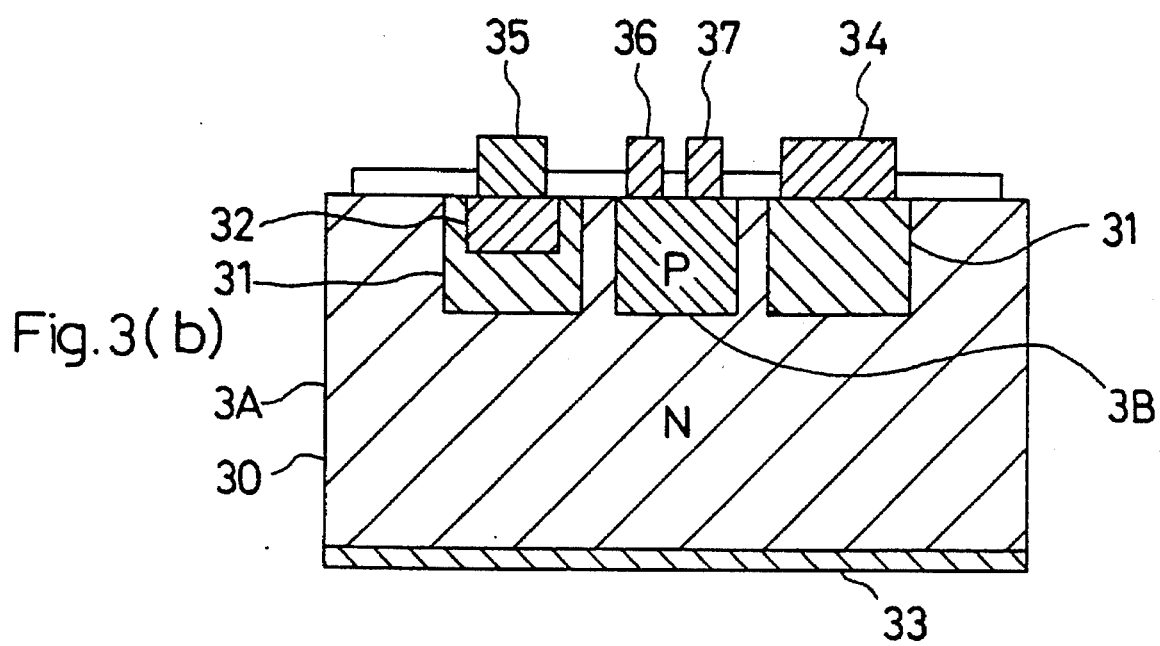

FIGS. 3(a) and (b) show a semiconductor device 3 according to the third embodiment, in which FIG. 3(a) is a plan view thereof and FIG. 3(b) is a section taken along III—III in FIG. 3(a). For the brevity's sake, electrodes are omitted in FIG. 3(a).

As shown in FIGS. 3(a) and (b), the semiconductor device 3 includes a collector region 30 which is an N-type silicon substrate, an annular base region 31 formed on a center part of the collector region 30, a C-shaped emitter region 32 formed on the base region 31, and an H-shaped resistor 3B for temperature detection which is formed, as a temperature detection element, at a vacant region within the base region 31 and the emitter region 32 on the collector region 30.

A collector electrode 33 is provided at a lower surface of the collector region 30. A base electrode 34 is provided on the base region 31. An emitter electrode 35 is provided on the emitter region 32. Temperature detection electrodes 36, 37 are provided on the temperature detection resistor 3B.

A transistor 3A for output is, as a semiconductor element for output, composed of the collector region 30, the base region 31 and the emitter region 32. As described above, the temperature detection resistor 3B is formed on the center of the N-type silicon substrate which composes the collector region 30, and the output transistor 3A is provided so as to surround the temperature detection resistor 3B.

Discussed below is about a method of manufacturing the semiconductor device 3 according to the third embodiment.

First, boron is selectively diffused in an N-type silicon substrate (to be the collector region 30 of NPN transistor) in which phosphorus is diffused so as to form the base region 31 and the temperature detection resistor 3B of the NPN transistor at the same time.

Next, phosphorus is selectively diffused in the base region 31 to form the emitter region 32 of the NPN transistor. Thereafter, the collector electrode 33, the base electrode 34, the emitter electrode 35 and the temperature detection electrodes 36, 37 are provided respectively at the lower surface of the collector region 30, on the base region 31, on the emitter region 32, on the temperature detection resistor 3B.

In this way, the output transistor 3A and the temperature detection resistor 3B of NPN transistor are formed respectively on the N-type silicon substrate.

Explained below is about a method for detecting temperature of the output transistor 3A by the temperature detection resistor 3B in the semiconductor device 3 according to the third embodiment.

When the output transistor 3A is operated at 40 W (20 V voltage, 2 A current, 50% duty), the resistance thereof measures 5000 Ω. When the output transistor 3A is operated at 60 W (20 V voltage, 3 A current, 50% duty), the resistance thereof measures 7000Ω.

On the other hand, when the temperature of the output transistor 3A operated in steady state is measured using the thermocouple, the temperature of the output transistor 3A is 170° C. at 40 W and 230° C. at 60 W.

Since the resistance of the temperature detection resistor 3B varies according to the temperature of the output transistor 3A, the temperature of the output transistor 3A is made correspondent to the resistance of the temperature detection resistor 3B. Consequently, by measuring the resistance of the temperature detection resistor 3B, the temperature of the output transistor 3A is easily detected.

In the semiconductor device 3 according to the third embodiment, since the temperature detection transistor 3B is formed within the output transistor 3A, a dispersion of the detected temperature due to difference in location between the output transistor 3A and the temperature detection transistor 3B is reduced, and the time lag between the temperature of the output transistor 3A and the detected temperature due to the distance between the output transistor 3A and the temperature detection transistor 3B is cleared.

Consequently, with the semiconductor device 3 according to the third embodiment, accuracy and rapidity in detecting the temperature of the output transistor 3A is enhanced.

Described below is a semiconductor device 4 according to a fourth embodiment of the present invention.

Figure 4:
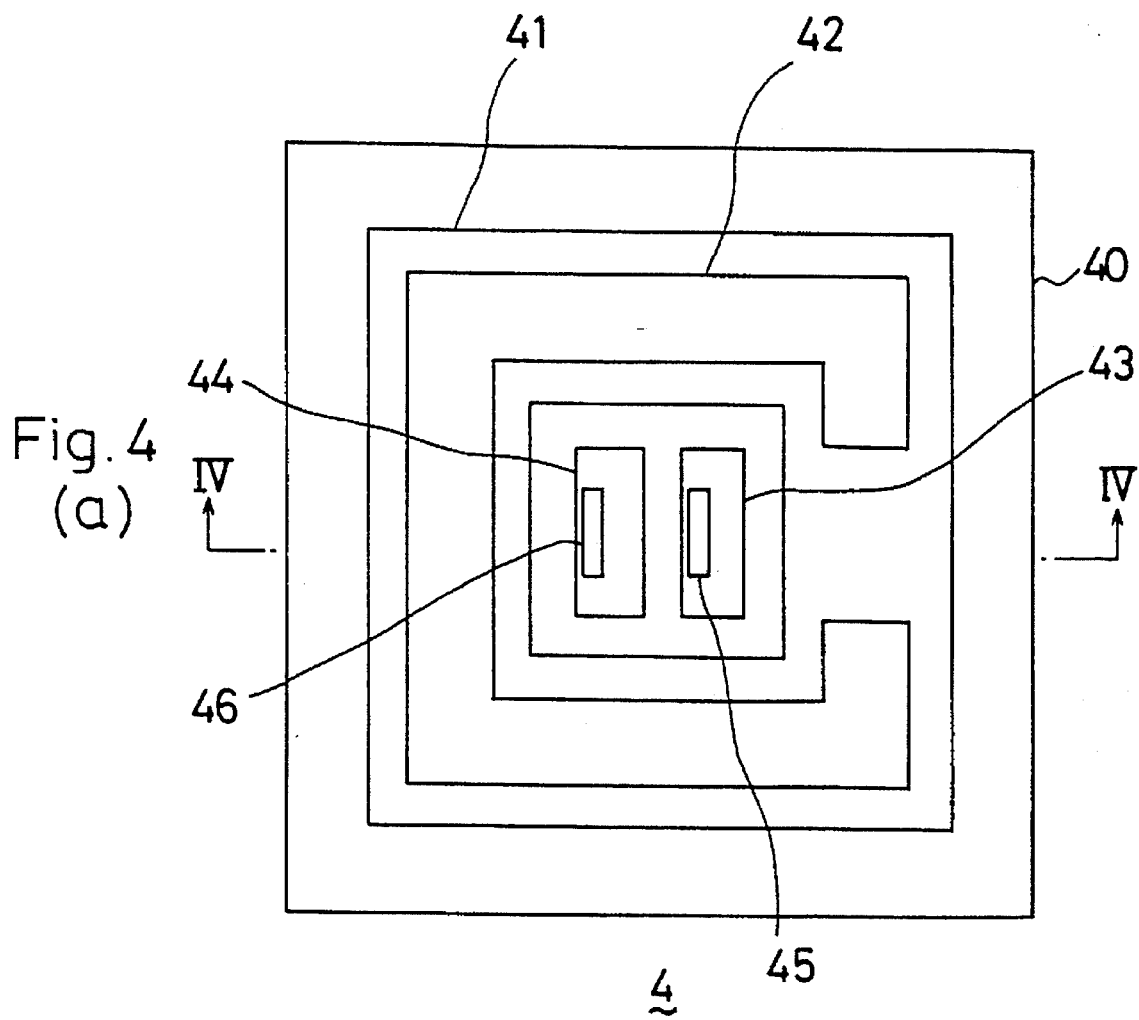
Figure 4:
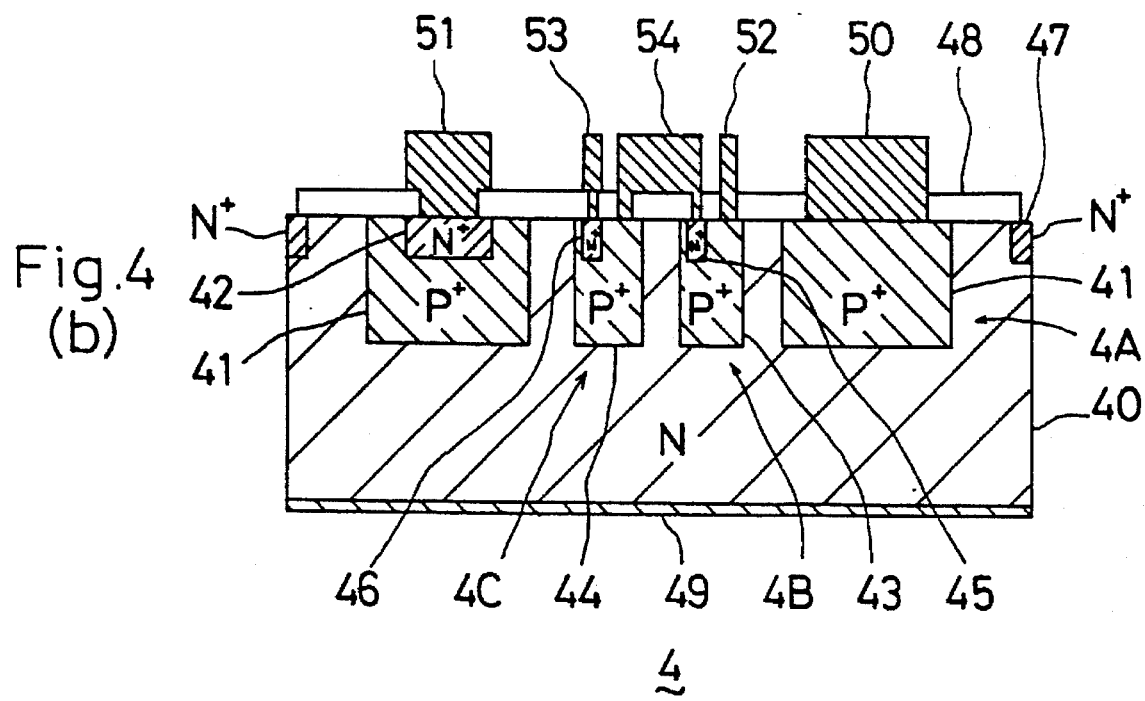

FIGS. 4(a) and (b) show a semiconductor device 4 according to the fourth embodiment, in which FIG. 4(a) is a plan view thereof and FIG. 4(b) is a section taken along IV—IV in FIG. 4(a). For the brevity's sake, electrodes are omitted in FIG. 3(a).

As shown in FIGS. 4(a) and (b), the semiconductor device 4 includes a collector region 40 which is an N-type silicon substrate, an annular first base region 41 of P⁺region which is formed on a center part of the collector region 40, a C-shaped first emitter region 42 of N⁺region which is formed on the first base region 41, a second base region 43 and a third base region 44 of P⁺region which are formed in a vacant region within the first base region 41 on the collector region 40, a second emitter region 45 of N⁺region which is formed on the second base region 43 and a third emitter region 48 of N⁺region which is formed on the third base region 44. In FIG. 4(b), reference numeral 47 indicates a channel stopper region formed on the collector region 40, and 48 indicates an insulating film.

A collector electrode 49 is provided at a lower surface of the collector region 40. A first base electrode 50 is provided on the first base region 41. A first emitter electrode 51 is provided on the first emitter region 42. A second base electrode 52 is provided on the second base region 43. A third emitter electrode 53 is provided on the third emitter region 46. The second emitter region 45 and the third base region 44 are electrically connected by a Darlington-connection electrode 54.

A transistor 4A for output is, as an output semiconductor element, composed of the collector region 40, the first base region 41 and the first emitter region 42. A first transistor 4B is composed of the collector region 40, the second base region 43 and the second emitter region 45, and a second transistor 4C is composed of the collector region 40, the third base region 44 and the third emitter region 46. A temperature detection transistor is composed of the first transistor 4B and the second transistor 4C which are Darling-ton-connected with each other. As described above, the Darlington-connected transistors 4B, 4C are provided at the center part of the N-type silicon substrate which composes the collector region 40, and the output transistor 4A is provided so as to surround the Darlington-connected transistors 4B, 4C.

Discussed below is about a method of manufacturing the semiconductor device 4 according to the fourth embodiment.

First, boron is selectively diffused in an N-type silicon substrate (to be the collector region 40 of NPN transistor) in which phosphorus is diffused so as to concurrently form the first base region 41, the second base region 43 and the third base region 44 which are separated from one another.

Next, phosphorus; is selectively diffused in first, second and third base regions 41, 43, 44 to form the first emitter region 42, the second emitter region 45 and the third emitter region 46 respectively. Thereafter, the collector electrode 49, the first base electrode 50, the first emitter electrode 51, the second base electrode 52 and the third emitter electrode 53 are provided respectively at the lower surface of the collector region 40, on the first base region 41, on the first emitter region 42, on the second base region 43 and on the third emitter region 46. Further, the Darlington-connection electrode 54 is provided over the third base region 44 and the second emitter region 45.

In this way, the output transistor 4A of NPN transistor and first and second transistors 4B, 4C of NPN transistor are formed respectively on the N-type silicon substrate.

Discussed below is about a comparable test conducted for evaluating the semiconductor device 4 according to the fourth embodiment.

Figure 8A:
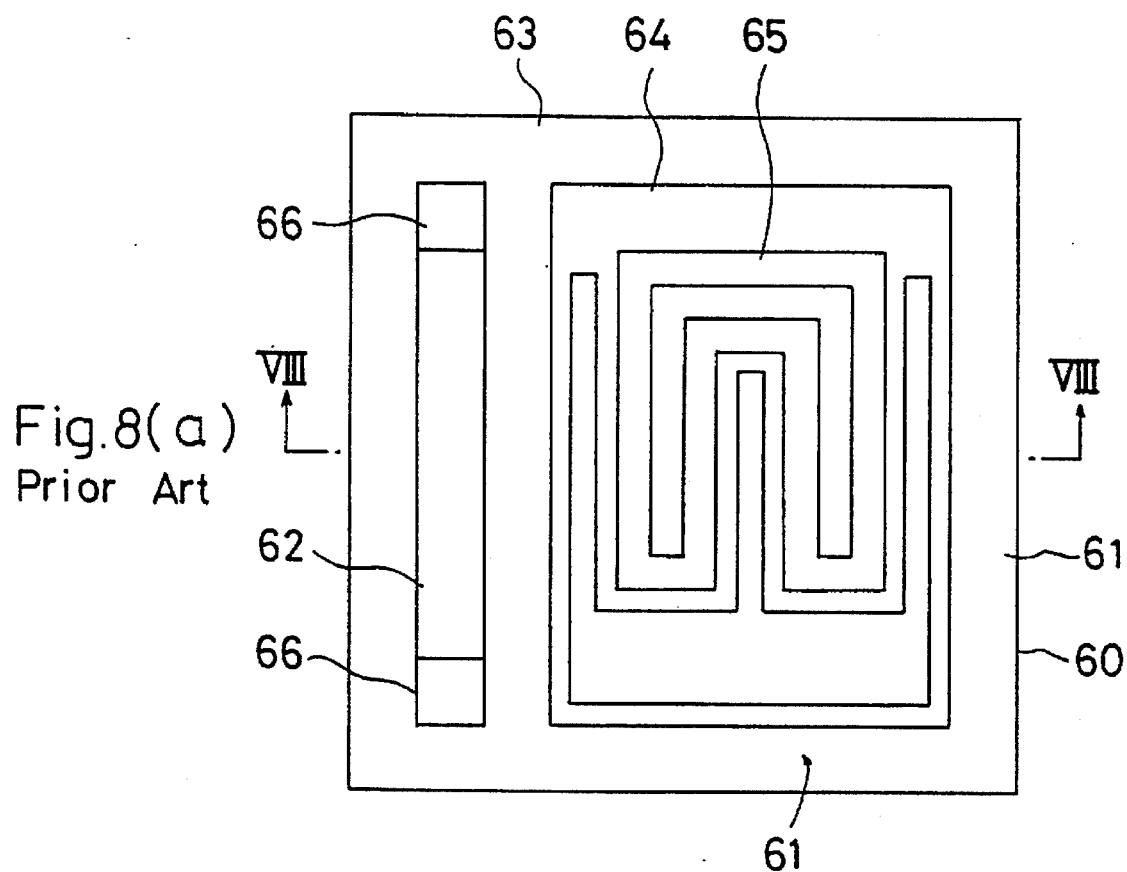
Figure 8B:
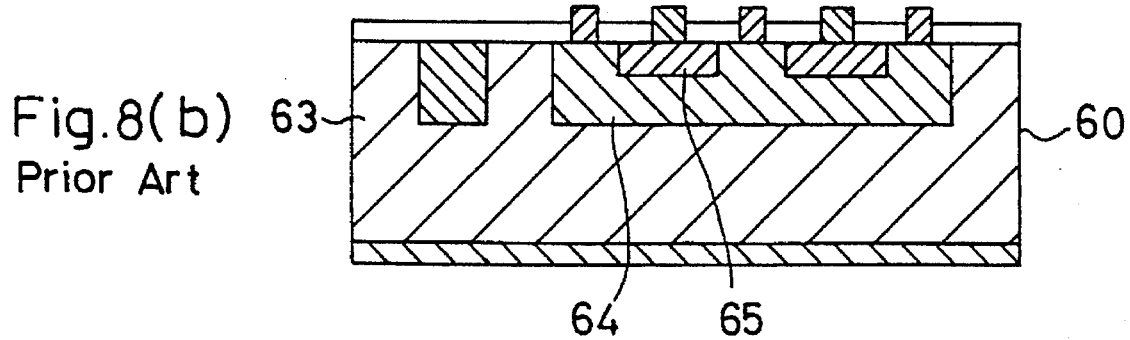

When the output transistor in the semiconductor device 4 according to the fourth embodiment and an output transistor in a conventional semiconductor device shown in FIGS. 8(a), (b) are operated at 40 W (20 V voltage, 2 A current, 50% duty) and at 60 W (20 V, 3 A current, 50% duty), forward voltages $V_{BE}$ at PN junction parts of the respective temperature detection transistors are measured. Also, when the output transistors operated in steady state in the respective semiconductor devices are measured, using a thermocouple. The respective measured results are shown in Table 1.

TABLE 1

| operation current | $V_{BE}$ and temperature of temperature detection transistor | | temperature of output transistor (actual) |
|---|---|---|---|
| | 4th embodiment | conventional | |
| 40 W | 680 mV(170° C.) | 300 mV(150° C.) | 170° C. |
| 60 W | 920 mV(230° C.) | 400 mV(200° C.) | 230° C. |

As cleared from Table 1, the semiconductor device according to the fourth embodiment measures the temperature of the output transistor accurately, compared with the conventional semiconductor device.

FIG. 5 shows a comparison of dispersion of the detected temperature in the semiconductor devices according to first and second embodiments with that of the detected temperature in a conventional semiconductor device having, as a temperature sensor, a thermistor at an external part of a semiconductor substrate. Wherein, the semiconductor devices according to first and second embodiments and the conventional semiconductor are employed to an audio system, and the temperature of the output transistor is set to be 210° C.

In FIG. 5, P indicates a distribution area of the detected temperature in the semiconductor devices according to first and second embodiments, and Q indicates a distribution area of the detected temperature in the conventional semiconductor device. As shown in FIG. 5, the dispersion of the detected temperature in first and second embodiments is remarkably smaller than that in the conventional semiconductor device.

FIG. 6 shows a comparison of dispersion of the detected temperature in the semiconductor device according to the third embodiment with that in the conventional semiconductor device. Wherein, the semiconductor device according to the third embodiment and the conventional semiconductor device are employed to an audio system, and the temperature of the output transistor is set to 210° C.

As shown in FIG. 6, the dispersion area of the detected temperature in the semiconductor device according to the third embodiment is smaller than that in the conventional semiconductor device, but is not so small as that according to first and second embodiments.

FIG. 7 shows a comparison of dispersion of the detected temperature in the semiconductor device according to the fourth embodiment with that in the conventional semiconductor device. Wherein, the semiconductor device according to the fourth embodiment and the conventional semiconductor device are employed to an audio system, and the temperature of the output transistor is set to 210° C.

As shown in FIG. 7, the dispersion of the detected temperature in the semiconductor device according to the fourth embodiment is remarkably smaller than that in the conventional semiconductor device, and smaller than that according to first and second embodiments.

A high voltage is applied to the audio system generally even at a normal operation, so that the temperature of the semiconductor device built in the audio system is increased, compared with semiconductor devices built in other systems. This means that fault of the audio system often happens owing to the semiconductor device. When the semiconductor device according to the present invention is built in the audio system, the fault occurrence rate of the audio system is lowered.

In first to fourth embodiments, a single transistor formed on the semiconductor substrate is used as the output transistor. However, the equivalent effect is obtained even when the Darlington transistor is formed thereon as the output transistor, instead of the single transistor.

We claim:

1. A semiconductor device, comprising:
    a semiconductor substrate;
    an amplifying transistor element for amplifying current or voltage formed on said semiconductor substrate; and
    a temperature detection transistor for detecting the temperature of said amplifying transistor element, which is formed on said semiconductor substrate,
    wherein the collector of said amplifying transistor element and the collector of said temperature detection transistor are formed in a same region, the base of said amplifying transistor element and the base of said temperature detection transistor are respectively formed in different regions, and the emitter of said amplifying transistor element and the emitter of said temperature detection transistor are respectively formed in different regions.

2. The semiconductor device according to claim 1, wherein the emitter of said amplifying transistor element comprises a C-shape configuration.

3. The semiconductor device according to claim 1, wherein the base of said amplifying transistor element and the base of said temperature detection transistor are equal in depth to each other.

4. A semiconductor device, comprising:
    a semiconductor substrate;
    an amplifying transistor element for amplifying current or voltage formed on said semiconductor substrate; and
    a temperature detection element for detecting the temperature of said amplifying transistor element, which is formed on said semiconductor substrate,
    wherein the base of said amplifying transistor element comprises a ring configuration, and said temperature detection element is surrounded by the base of said amplifying transistor element.

5. The semiconductor device according to claim 4, wherein the emitter of said amplifying transistor element comprises a C-shape configuration.

6. The semiconductor device according to claim 4, wherein the base of said amplifying transistor element and said temperature detection element are equal in depth to each other.

7. A semiconductor device, comprising:
    a semiconductor substrate;
    an amplifying transistor element for amplifying current or voltage formed on said semiconductor substrate;
    a temperature detection diode for detecting the temperature of said amplifying transistor element, which is formed on said semiconductor substrate,
    wherein said temperature detection diode is surrounded by the collector of said amplifying transistor element, and the base of said amplifying transistor element and said temperature detection diode are equal in depth to each other.

* * * * *

UNITED STATES PATENT AND TRADEMARK OFFICE
CERTIFICATE OF CORRECTION

PATENT NO.    : 5,629,551
DATED         : May 13, 1997
INVENTOR(S)   : Hideaki NAKURA et al.

It is certified that error appears in the above-indentified patent and that said Letters Patent is hereby corrected as shown below:

On title page, item [73] change "Matsushita Electric Industrial Co., Ltd." to --Matsushita Electronics Corporation--.

Signed and Sealed this

Second Day of December, 1997

*Attest:*

BRUCE LEHMAN

*Attesting Officer*            *Commissioner of Patents and Trademarks*